United States Patent
Tanaka et al.

(10) Patent No.: US 7,134,060 B2
(45) Date of Patent: Nov. 7, 2006

(54) SEMICONDUCTOR INTEGRATED CIRCUIT INCLUDING OPERATION TEST CIRCUIT AND OPERATION TEST METHOD THEREOF

(75) Inventors: Yoshiyuki Tanaka, Kanagawa (JP); Yoshinari Ojima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 435 days.

(21) Appl. No.: 10/752,504

(22) Filed: Jan. 8, 2004

(65) Prior Publication Data

US 2004/0193991 A1    Sep. 30, 2004

(30) Foreign Application Priority Data

Jan. 8, 2003    (JP)    .............. 2003-001741

(51) Int. Cl.
G01R 31/28    (2006.01)
G06F 11/00    (2006.01)

(52) U.S. Cl. ...................... 714/724; 714/707

(58) Field of Classification Search .............. None
See application file for complete search history.

(56) References Cited

U.S. PATENT DOCUMENTS 5,671,260 A * 9/1997 Yamauchi et al. .......... 375/372
6,114,890 A * 9/2000 Okajima et al. ............ 327/170
6,597,747 B1 * 7/2003 Azuma ....................... 375/298
7,023,946 B1 * 4/2006 Sawada et al. .............. 375/375

FOREIGN PATENT DOCUMENTS

JP    10-339769    12/1998

* cited by examiner

*Primary Examiner*—Phung My Chung
(74) *Attorney, Agent, or Firm*—Oblon, Spivak, McClelland, Maier & Neustadt, P.C.

(57) ABSTRACT

A semiconductor integrated circuit disclosed herein comprising: a phase control circuit which shifts a phase of a first clock signal based on a phase control signal and outputs a second clock signal; a first flip-flop to which one of the first clock signal and the second clock signal is inputted as a first operation clock signal, and which outputs evaluation data; a circuit under test which performs a predetermined process based on the evaluation data and outputs a result of the process as output data; and a second flip-flop to which the other of the first clock signal and the second clock signal is inputted as a second operation clock signal and the output data is inputted, and which outputs the output data inputted from the circuit under test.

20 Claims, 9 Drawing Sheets

US 7,134,060 B2

SEMICONDUCTOR INTEGRATED CIRCUIT INCLUDING OPERATION TEST CIRCUIT AND OPERATION TEST METHOD THEREOF

CROSS REFERENCE TO RELATED APPLICATION

This application claims benefit of priority under 35 U.S.C. §119 to Japanese Patent Application No. 2003-001741, filed on Jan. 8, 2003, the entire contents of which are incorporated by reference herein.

BACKGROUND OF THE INVENTION

1. Field of the Invention

The present invention relates to a semiconductor integrated circuit including an operation test circuit and an operation test method thereof.

2. Related Background Art

Hitherto, an operation test of an semiconductor integrate circuit (hereinafter referred to as an LSI) has been generally performed by supplying an operation test clock signal to the LSI by an external LSI tester.

Recently, however, the operation performance of the LSI has achieved further development, and consequently the frequency of the clock signal supplied from the external LSI tester and an operating frequency in an actual operation become widely different, whereby the operation test of the LSI on the assumption of the actual operation is becoming more and more difficult.

Against this background, an operation test circuit for apparently realizing an operation test by a high-frequency clock signal by using a relatively low-frequency operation test clock signal is proposed (for example, see pages 3 and 4 and FIG. 1 and FIG. 3 of Japanese Patent No. 2953435 which corresponds to Laid-Open Patent Publication No. H10-339769).

FIG. 10 is a diagram showing the configuration of a related operation test circuit. A first and second flip-flops 102 and 103 are provided at both ends of a path, which is to be subjected to an operation test, of a circuit under test 101. Evaluation data D is inputted to the circuit under test 101 via the first flip-flop 102, and output data D' is outputted therefrom via the second flip-flop 103. Moreover, the evaluation data D, a normal clock C, and a test clock C2 are inputted to each of the first and second flip-flops 102 and 103. The circuit under test 101 here is, for example, a logic circuit.

The first and second flip-flops 102 and 103 are each composed of a master latch and a slave latch, and at a point in time when the logical value of at least one of the normal clock C and the test clock C2 changes from a state of 0 to a state of 1, the evaluation data D is inputted and held in the master latch, whereas at a point in time when the normal clock C changes to the logical value 1, the evaluation data D is outputted via the slave latch. Namely, in a normal operation, the first and second flip-flops 102 and 103 operate as one-phase synchronous flip-flops by maintaining the test clock C2 at the logical value 0, whereas in an operation test, they operate as two-phase synchronous flip-flops by controlling the normal clock C and the test clock C2, whereby the master latch and the slave latch can be controlled separately.

Now, the operation of these flip-flops when the normal clock C and the test clock C2 are inputted at timing shown in FIG. 11 will be considered.

First, attention is focused on the operation of the former-stage flip-flop 102. When the test clock C2 rises from the logical value 0 to the logical value 1 at a point in time t11, the evaluation data D is inputted to the master latch and held therein. Then, when the normal clock C rises at a point in time t12 later than the rising edge of the test clock C2, the evaluation data D held in the master latch is outputted from the slave latch and inputted to a path inside the circuit under test 101 which is to be subjected to the operation test. Next, the operation of the latter-stage flip-flop 103 of the path to be tested will be considered. The evaluation data D is inputted to the master latch when the test clock C2 rises again at a point in time t13.

From the aforementioned operations of the flip-flops, it is understood that the evaluation data D is inputted to the path to be tested at the point in time t12 and outputted therefrom at the point in time t13. When viewed from the path to be tested, this case can be substantially regarded as the same as a case where the flip-flops are operated by a clock with a time interval between the point in time t12 and the point in time t13 as a period. The time interval between the point in time t12 and the point in time t13 is shorter than an actual clock period, and hence it becomes possible to apparently realize the operation test by a high-frequency clock signal by using a relatively low-frequency operation test clock signal.

However, the object of the aforementioned related operation test circuit is only to apparently realize the operation test by the high-frequency clock signal by using the relatively low-frequency clock signal. Therefore, a maximum operating frequency fmax at which the circuit to be tested normally operates cannot be found out.

Moreover, in the aforementioned related operation test circuit, only one path to be evaluated is fixed by positions where two-phase synchronous flip-flops are provided, which cannot cope with a case where the path to be evaluated needs to be changed in the operation test.

SUMMARY OF THE INVENTION

In order to accomplish the aforementioned and other objects, according to one aspect of the present invention, a semiconductor integrated circuit, comprises:

a phase control circuit to which a first clock signal is inputted, and which shifts a phase of the first clock signal based on a phase control signal and outputs the resultant signal as a second clock signal;

a first flip-flop to which one of the first clock signal and the second clock signal is inputted as a first operation clock signal, and which operates in synchronization with an edge of the inputted first operation clock signal and outputs evaluation data;

a circuit under test to which the evaluation data is inputted, and which performs a predetermined process based on the evaluation data and outputs a result of the process as output data; and a second flip-flop to which the other of the first clock signal and the second clock signal is inputted as a second operation clock signal and the output data is inputted, and which operates in synchronization with an edge of the inputted second operation clock signal and outputs the output data inputted from the circuit under test.

According to another aspect of the present invention, a control method of a semiconductor integrated circuit, comprises:

controlling a phase control circuit based on a phase control signal to shift a phase of a first clock signal and outputting the resultant signal as a second clock signal;

inputting one of the first clock signal and the second clock signal as a first operation clock signal to a first flip-flop, operating the first flip-flop in synchronization with an edge of the inputted first operation clock signal, and outputting evaluation data;

inputting the evaluation data to a circuit under test, performing a predetermined process based on the evaluation data, and outputting a result of the process as output data; and inputting the other of the first clock signal and the second clock signal as a second operation clock signal to a second flip-flop and inputting the output data, operating the second flip-flop in synchronization with an edge of the inputted second clock signal, and outputting the output data inputted from the circuit under test.

According to another aspect of the present invention, a semiconductor integrated circuit, comprises:

a phase control circuit to which a first clock signal is inputted, and which shifts a phase of the first clock signal based on a phase control signal and outputs the resultant signal as a second clock signal;

a first selector to which the first clock signal and the second clock signal are inputted, and which outputs one of the first clock signal and the second clock signal as a first operation clock signal based on a first selector control signal;

a first flip-flop to which the first operation clock signal is inputted, and which operates in synchronization with an edge of the first operation clock signal and outputs evaluation data;

a circuit under test to which the evaluation data is inputted, and which performs a predetermined process based on the evaluation data and outputs a result of the process as output data;

a second selector to which the first clock signal and the second clock signal are inputted, and which outputs the other of the first clock signal and the second clock signal as a second operation clock signal based on a second selector control signal; and a second flip-flop to which the second operation clock signal is inputted and the output data is inputted, and which operates in synchronization with an edge of the second operation clock signal and outputs the output data inputted from the circuit under test.

According to another aspect of the present invention, a control method of a semiconductor integrated circuit, comprises:

controlling a phase control circuit based on a phase control signal to shift a phase of a first clock signal and outputting the resultant signal as a second clock signal;

controlling a first selector based on a first selector control signal to output one of the first clock signal and the second clock signal as a first operation clock signal;

inputting the first operation clock signal to a first flip-flop, operating the first flip-flop in synchronization with an edge of the first operation clock signal, and outputting evaluation data;

inputting the evaluation data to a circuit under test, performing a predetermined process based on the evaluation data, and outputting a result of the process as output data;

controlling a second selector based on a second selector control signal to output the other of the first clock signal and the second clock signal as a second operation clock signal; and inputting the second operation clock signal to a second flip-flop and inputting the output data, operating the second flip-flop in synchronization with an edge of the inputted second clock signal, and outputting the output data inputted from the circuit under test.

According to another aspect of the present invention, a semiconductor integrated circuit, comprises:

a phase control circuit to which a first clock signal is inputted, and which shifts a phase of the first clock signal based on a phase control signal and outputs the resultant signal as a second clock signal;

a first selector to which the first clock signal and the second clock signal are inputted, and which outputs one of the first clock signal and the second clock signal as a first operation clock signal based on a first selector control signal;

an evaluation data generating circuit which generates evaluation data and outputs the evaluation data;

a first flip-flop to which the first operation clock signal and the evaluation data are inputted, and which operates in synchronization with an edge of the first operation clock signal and outputs the evaluation data;

a circuit under test to which the evaluation data is inputted, and which performs a predetermined process based on the evaluation data and outputs a result of the process as output data;

a second selector to which the first clock signal and the second clock signal are inputted, and which outputs the other of the first clock signal and the second clock signal as a second operation clock signal based on a second selector control signal;

a second flip-flop to which the second operation clock signal is inputted and the output data is inputted, and which operates in synchronization with an edge of the second operation clock signal and outputs the output data inputted from the circuit under test;

an expected value comparison circuit to which the output data is inputted from the second flip-flop, and which compares an expected value expected from the evaluation data and the output data; and a sequence circuit which controls the phase control circuit, the first selector, the second selector, the evaluation data generating circuit, and the expected value comparison circuit and, wherein the sequence circuit sequentially shifts a phase of the second clock signal so that a phase difference between the first clock signal and the second clock signal increases until the output data and the expected value become non-coincident when the output data and the expected value coincide in the expected value comparison circuit.

According to another aspect of the present invention, a control method of a semiconductor integrated circuit, comprises:

controlling a phase control circuit based on a phase control signal to shift a phase of a first clock signal and outputting the resultant signal as a second clock signal;

controlling a first selector based on a first selector control signal to output one of the first clock signal and the second clock signal as a first operation clock signal;

generating evaluation data in an evaluation data generating circuit and outputting the evaluation data from the evaluation data generating circuit;

inputting the first operation clock signal and the evaluation data to a first flip-flop, operating the first flip-flop in synchronization with an edge of the first operation clock signal, and outputting the evaluation data;

inputting the evaluation data to a circuit under test, performing a predetermined process based on the evaluation data, and outputting a result of the process as output data;

controlling a second selector based on a second selector control signal to output the other of the first clock signal and the second clock signal as a second operation clock signal;

inputting the second operation clock signal and the output data to a second flip-flop, operating the second flip-flop in synchronization with an edge of the second clock signal, and outputting the output data inputted from the circuit under test;

inputting the output data from the second flip-flop to an expected value comparison circuit and comparing an expected value expected from the evaluation data and the output data; and controlling the phase control circuit, the first selector, the second selector, the evaluation data generating circuit, and the expected value comparison circuit, and sequentially shifting a phase of the second clock signal so that a phase difference between the first clock signal and the second clock signal increases until the output data and the expected value become non-coincident when the output data and the expected value coincide in the expected value comparison circuit.

DESCRIPTION OF THE PREFERRED EMBODIMENTS (First Embodiment)

Hereinafter, a first embodiment of a semiconductor integrated circuit including an operation test circuit and an operation test method will be explained with reference to FIG. 1 to FIG. 4.

Figure 1:
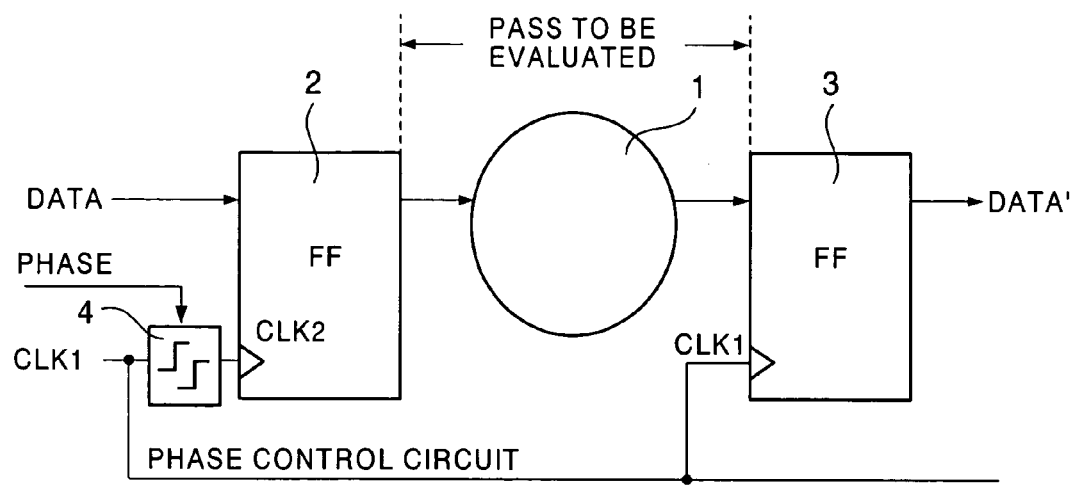
FIG. 1 is a schematic diagram showing the configuration of a semiconductor integrated circuit including an operation test circuit according to a first embodiment.

First, a semiconductor integrated circuit including an operation test circuit according to this embodiment will be explained with reference to FIG. 1 to FIG. 3. FIG. 1 schematically shows the configuration of the semiconductor integrated circuit including the operation test circuit according to this embodiment.

A first and second flip-flops 2 and 3 are provided at both ends of a circuit under test 1 on which an operation test is to be performed. Evolution data DATA is inputted to the circuit under test 1 via the first flop-flop 2, and output data DATA' is outputted via the second flip-flop 3.

A fist clock signal CLK1 for flip-flop control is supplied to the second flip-flop 3, and a second clock signal CLK2, which is obtained by the first clock signal CLK1 being processed in a phase control circuit 4, is supplied to the first flip-flop 2.

The phase control circuit 4 is a circuit which can variably shift the phase of a clock signal based on a phase control signal PHASE, and the phase control circuit 4 shifts the phase of the inputted first clock signal CLK1 and outputs the resultant signal as the second clock signal CLK2. Among examples of the phase control circuit 4 are a configuration using feedback control like a DDL (Digital Delay Line) and a configuration in which plural delay cell are provided and in which the number of stages thereof is switched. Here, the phase control circuit 4 is configured such that a test performer can freely set phase control by the phase control circuit 4 with the phase control signal PHASE, for example, by means of an external command.

In a normal operation, clock signals, which are synchronized each other, are supplied to the first and second flip-flops 2 and 3 to operate them without their phases being shifted by the phase control circuit 4. On the other hand, in an operation test, the phase control circuit 4 performs a phase control operation by the phase control signal PHASE to shift the phase of the first clock signal CLK1 and supplies the second clock signal CLK2 to the second flip-flop 2. As described just above, a phase difference is provided between the second clock signal CLK2 supplied to the first flip-flop 2 and the first clock signal CLK1 supplied to the second flip-flop 3 to perform the operation test.

Figure 2:
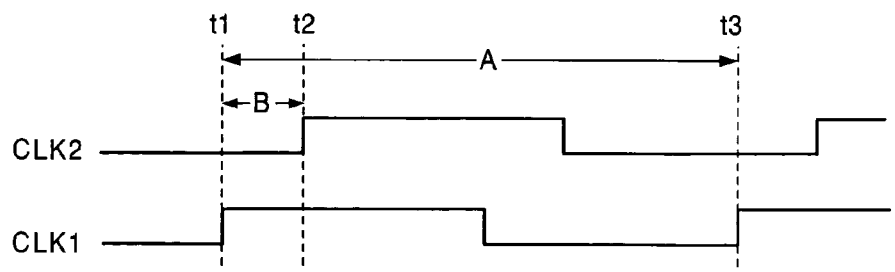
FIG. 2 is a waveform diagram of clock signals for flip-flop control in the semiconductor integrated circuit including the operation test circuit according to the first embodiment.

Next, FIG. 2 shows a waveform diagram of the clock signals for flip-flop control, which are supplied to the first and second flip-flops in the operation test.

The second clock signal CLK2 whose phase is controlled by the phase control circuit 4 is supplied to the first flip-flop 2, being delayed with respect to the first clock signal CLK1 by a delay time B. The operation test is performed by supplying these two clock signals CLK1 and CLK2 to the respective flip-flops and confirming whether an expected value which is expected from the evaluation data DATA inputted to the circuit under test 1 and the output data DATA' of the circuit under test 1 outputted via the second flip-flop 3 coincide with each other.

Now, the timing of input/output of the evaluation data DATA to/from the circuit under test 1 by these two clock signals CLK1 and CLK2 will be considered. A point in time when the evaluation data DATA is inputted to the circuit under test 1 is a first rising edge t2 of the second clock signal CLK2, and a point in time when it is outputted therefrom is a second rising edge t3 of the first clock signal CLK1. At this time, the rising edge t2 of the second clock signal CLK2 is delayed with respect to a rising edge t1 of the first clock signal CLK1 by the delay time B. Although the period of the actually supplied clock signal is A (=t3 −t1), as concerns the circuit under test 1, this case can be regarded as equivalent to a case where a clock signal with a period (A−B) is supplied. This makes it possible to perform the operation test by a clock signal of a frequency 1/(A−B) by using a clock signal of a frequency 1/A.

In the semiconductor integrated circuit including the operation test circuit according to this embodiment, the operation test circuit by an apparently high-frequency clock signal by using one clock signal is realized, whereby in performing the operation test, it is unnecessary to previously generate and supply plural different clock signals. Consequently, it is unnecessary to provide plural different clock signal lines and input terminals for test clock signals in the semiconductor integrated circuit. Hence, in this embodiment, necessary operation tests can be performed, and the small-area semiconductor integrated circuit in which an extra wiring region is reduced can be provided. Further, extra clock signal input terminals can be eliminated, whereby the semiconductor integrated circuit with the required minimum number of input terminals can be provided.

Moreover, as described above, the phase control circuit 4 enables the test performer to freely set the phase of the first clock signal CLK1, and therefore it is one of characteristics of the semiconductor integrated circuit including the operation test circuit according to this embodiment that the operation test can be performed at the test performer's desired frequency. This enables the test performer to gradually increase the delay time B using the phase control circuit 4, find a limit at which the expected value which is expected from the inputted evaluation data DATA becomes non-coincident with the actually outputted output data DATA', and find a maximum operating frequency fmax as $1/(A-Bn)$ from a delay time Bn when the limit is reached.

Further, by providing the phase control circuit 4 in such a manner that the clock signal whose phase is shifted is supplied to a specific flip-flop, the operation test only on a predetermined path to be subjected to the operation test becomes possible. This will be explained below with reference to FIG. 3.

Figure 3:
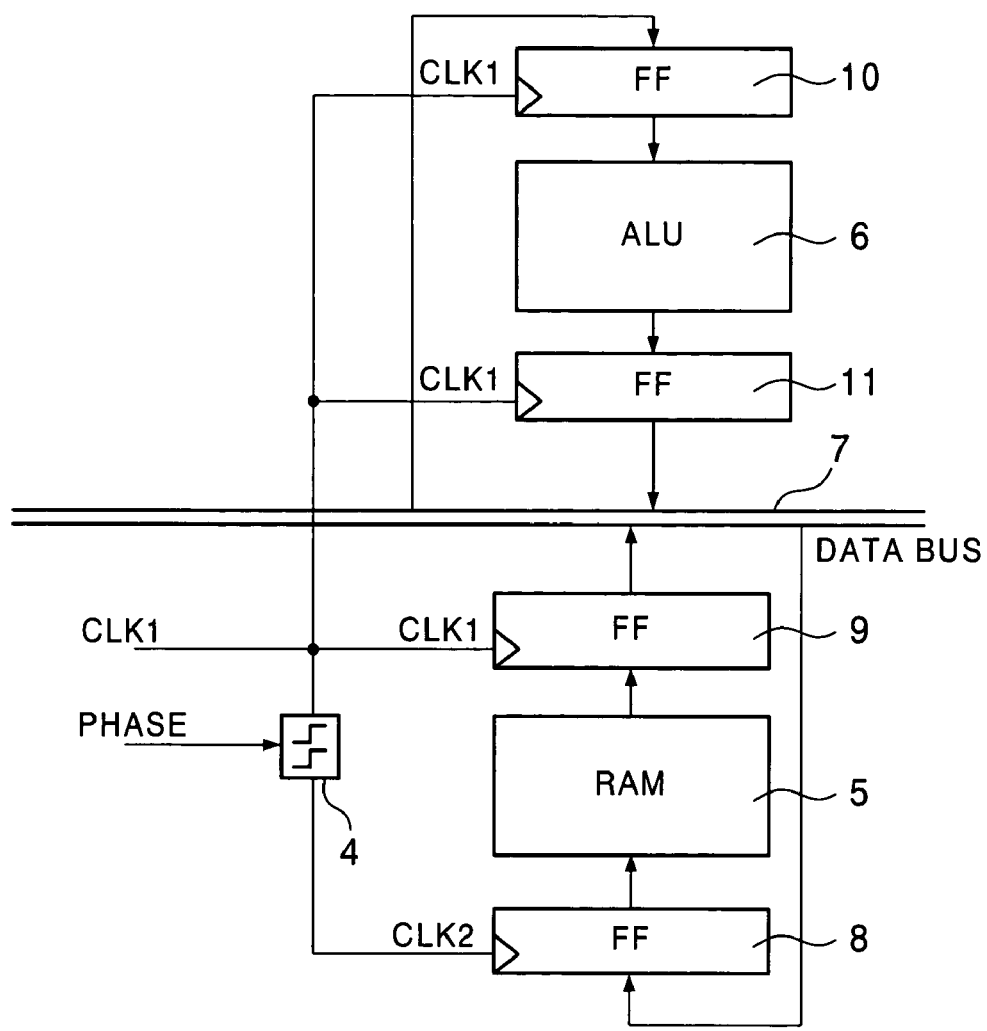
FIG. 3 is a diagram showing the circuit configuration of the semiconductor integrated circuit including the operation test circuit according to the first embodiment of the present invention.

FIG. 3 exemplifies the circuit configuration of the semiconductor integrated circuit including the operation test circuit according to this embodiment. A RAM (Random Access Memory) 5 and an ALU (Arithmetic Logical Unit) 6 can transfer data bidirectionally via a data bus 7, and four third to sixth flip-flops 8, 9, 10, and 11 are provided on respective input sides and output sides of the RAM 5 and ALU 6.

Now, the correspondence between components in FIG. 3 and those in FIG. 1 referred to in the previous explanation will be explained. The RAM 5 and the ALU6 in FIG. 3 correspond to the circuit under test 1 in FIG. 1. The third flip-flop 8 in FIG. 3 corresponds to the first flip-flop 2 in FIG. 1 when the RAM 5 is used as the circuit under test 1, whereas the fifth flip-flop 10 in FIG. 3 corresponds thereto when the ALU 6 is used as the circuit under test 1. The fourth flip-flop 9 in FIG. 3 corresponds to the second flip-flop 3 in FIG. 1 when the RAM 5 is used as the circuit under test 1, whereas the sixth flip-flop 11 in FIG. 3 corresponds thereto when the ALU 6 is used as the circuit under test 1.

When the maximum operating frequency fmax, for example, of a path from the third flip-flop 8 to the fourth flip-flop 9 needs to be evaluated in this circuit, as shown in FIG. 3, it is required to input the second clock signal CLK2 whose phase is shifted by the phase control circuit 4 to the third flip-flop 8 and input the first clock signal CLK1 whose phase is not shifted to the fourth flip-flop 9, the fifth flip-flop 10, and the sixth flip-flop 11.

In such a configuration, a case where the phase is shifted by B by the phase control circuit 4 will be considered. Since the second clock signal CLK1 which is obtained by shifting the phase of the first clock signal CLK1 is inputted to the third flop-flop 8, a phase difference occurs between the clock signals inputted to the third flip-flop 8 and the other flop-flops. As paths whose clock frequencies change apparently due to the occurrence of the phase difference, three paths, that is, a path from the third flip-flop 8 to the fourth flip-flop 9 via the RAM 5, a path from the fourth flip-flop 9 to the third flip-flop 8 via the data bus 7, and a path from the sixth flip-flop 11 to the third flip-flop 8 via the data bus 7 are thought of. However, the apparent clock frequencies of these three paths differ from one another. The apparent frequency of the path from the third flip-flop 8 to the fourth flip-flop 9 via the RAM 5 is as high as $1/(A-B)$, while the apparent frequencies of the remaining two paths are as low as $1/(A+B)$. Accordingly, in only the path from the third flip-flop 8 to the fourth flip-flop 9, the frequency of the clock signal apparently becomes high when the phase of the second clock signal CL2 is shifted by the phase control circuit 4. As a result, the maximum operating frequency fmax of only the path which the test performer of the operation test wants to evaluate can be evaluated without being influenced by the other paths.

Figure 4:
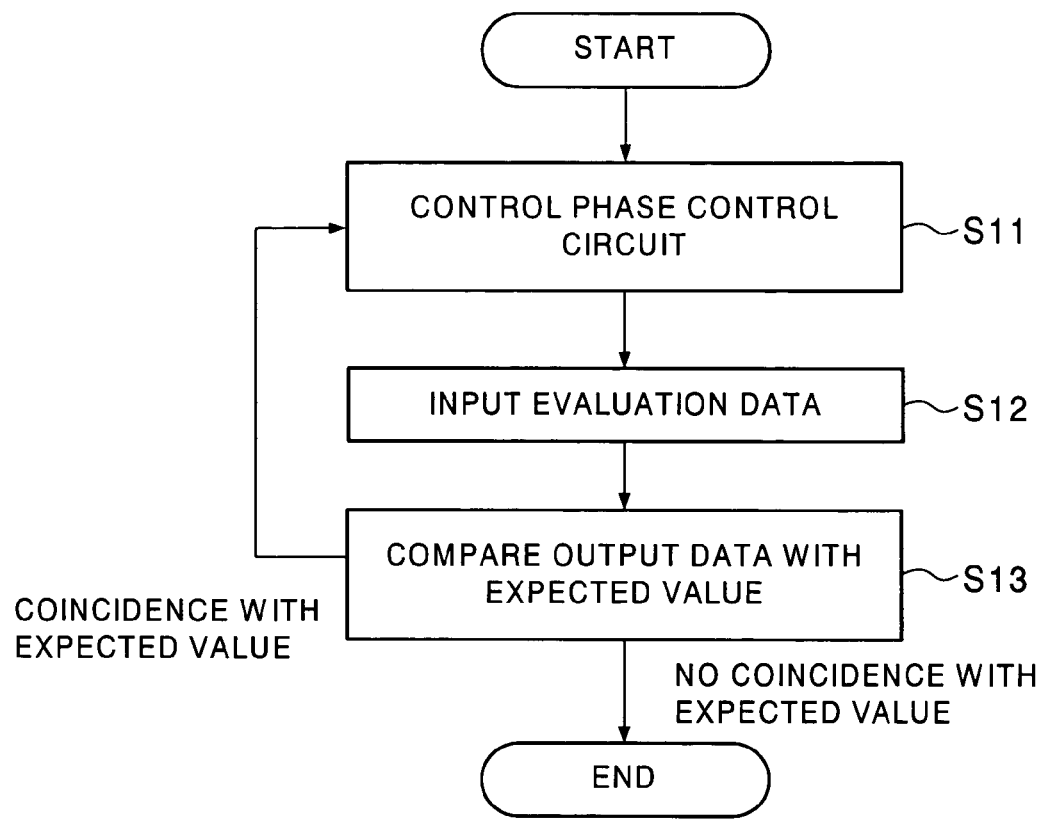
FIG. 4 is a flowchart showing the procedure of an operation test method according to the first embodiment.

Next, the operation test method of the semiconductor integrated circuit including the operation test circuit according to this embodiment will be explained with reference to FIG. 4. FIG. 4 is a flowchart showing the procedure of the operation test method according to this embodiment. Here, for convenience of explanation, an explanation will be given with a case where the maximum operating frequency fmax of the path from the third flip-flop 8 to the fourth flip-flop 9 is evaluated in the semiconductor integrated circuit including the operation test circuit in FIG. 3 as an example.

First, an apparent frequency $1/(A-B0)$ at which it needs to be first confirmed whether the circuit under test 1 operates normally is determined, and the phase control circuit 4 is allowed to perform the phase control operation by the phase control signal PHASE so that the phase of the first clock signal CLK1 is shifted by B0 (step S11).

Then, the second clock signal CLK2 is supplied to the third flip-flop 8 (which corresponds to the first flip-flop 2 in FIG. 1), and the first clock signal CLK1 is supplied to the fourth flip-flop 9 (which corresponds to the second flip-flop 3 in FIG. 1), the fifth flip-flop 10, and the sixth flip-flop 11.

Subsequently, the evaluation data DATA for the operation test is created and inputted to the third flip-flop 8 (step S12). Thereby, the evaluation data DATA is inputted to the RAM 5 (which corresponds to the circuit under test 1 in FIG. 1) via the third flip-flop 8, and as a result, the output data DATA' which is a result of an output of the RAM 5 is outputted via the fourth flip-flop 9.

Thereafter, it is confirmed whether the expected value which is expected from the evaluation data DATA inputted to the RAM 5 and the output data DATA' of the RAM 5 outputted via the fourth flip-flop 9 coincide with each other (step S13). The result of a comparison between the expected value and the output data DATA' indicates that the RAM 5 normally operates at the apparent frequency $1/(A-B0)$ when these values coincide, whereas it indicates that the operation of the RAM 5 breaks down at the apparent frequency $1/(A-B0)$ when these values do not coincide.

When the comparison result indicates coincidence in step S13, the procedure returns to step S11, and the phase control circuit 4 is controlled by the phase control signal PHASE to shift the phase of the first clock signal CLK1 by B1 (>B0) so that the phase difference between the first clock signal CLK1 and the second clock signal CLK2 increases. Subsequently, the evaluation data DATA is inputted to and outputted from the RAM 5 again, and a comparison with the expected value in step S13 is made. When the result of the comparison with the expected value indicates non-coincidence, it means that the operation of the RAM 5 breaks down at an apparent frequency 1/(A−B1), whereby it turns out that the maximum operating frequency fmax of the path from the third flip-flop 8 to the fourth flip-flop 9 is a value between 1/(A−B0) and 1/(A−B1).

When the result of the aforementioned second comparison with the expected value also indicates coincidence, the same steps as above are repeated until the result of the comparison with the expected value indicates non-coincidence. Thus, the maximum operating frequency fmax of the path from the third flip-flop 8 to the fourth flip-flop 9 can be measured.

As described above, in the operation test method according to this embodiment, the phase control circuit 4 can be controlled by the phase control signal PHASE, whereby while the apparent clock frequency is increased gradually, the operation of the circuit under test 1 at the increased clock frequency is confirmed, so that the maximum operating frequency fmax at which the circuit under test 1 operates normally can be measured.

Incidentally, in the operation test method according to this embodiment, first, the phase control circuit 4 is controlled (step S11), and then the evaluation data DATA is inputted (step S12), but the order of these steps is not limited to this. The same effect can be obtained as long as step S13 is performed after these two steps (steps S11 and S12) are completed irrespective of the order of these steps.

Moreover, in the semiconductor integrated circuit including the operation test circuit according to this embodiment and the operation test method thereof, the case where the phase of the clock signal inputted to the first flip-flop 2 is shifted by the phase control circuit 4 to perform the operation test is shown, but in addition to this case, for example, the phase of the clock signal supplied to the second flip-flop may be shifted by the phase control circuit 4. Further, the clock signal inputted to flip-flops other than the flip-flops provided at both ends of the path to be evaluated in the operation test is not limited to the first clock signal CLK1, but it may be the second clock signal CLK2. In other words, if, out of two clock signals which are respectively supplied to two flip-flops provided on the input side and the output side of a path whose maximum operating frequency fmax needs to be evaluated, a phase difference is set for either one of the clock signals in relation to the other clock signal, an operation test in which the apparent clock frequency of only the path to be evaluated is high can be performed.

Furthermore, in the semiconductor integrated circuit including the operation test circuit according to this embodiment and the operation test method thereof, a positive edge type flip-flop which operates in synchronization with a rising edge of a clock signal is used as each of the flip-flops. On the other hand, even when a negative edge type flip-flop which operates in synchronization with a falling edge of the clock signal is used as each of these flip-flops, the same effect as the case where the positive edge type flip-flops are used can be obtained.

Besides, in the semiconductor integrated circuit including the operation test circuit according to this embodiment and the operation test method thereof, the RAM and the ALU are shown as examples of the circuit under test 1, but the circuit under test 1 is not limited to these. In any path sandwiched between two flip-flops whose inputted clock signals have a phase difference therebetween, the maximum operating frequency fmax of the path can be evaluated whatever the configuration of the circuit under test 1 may be.

(Second Embodiment)

Figure 5:
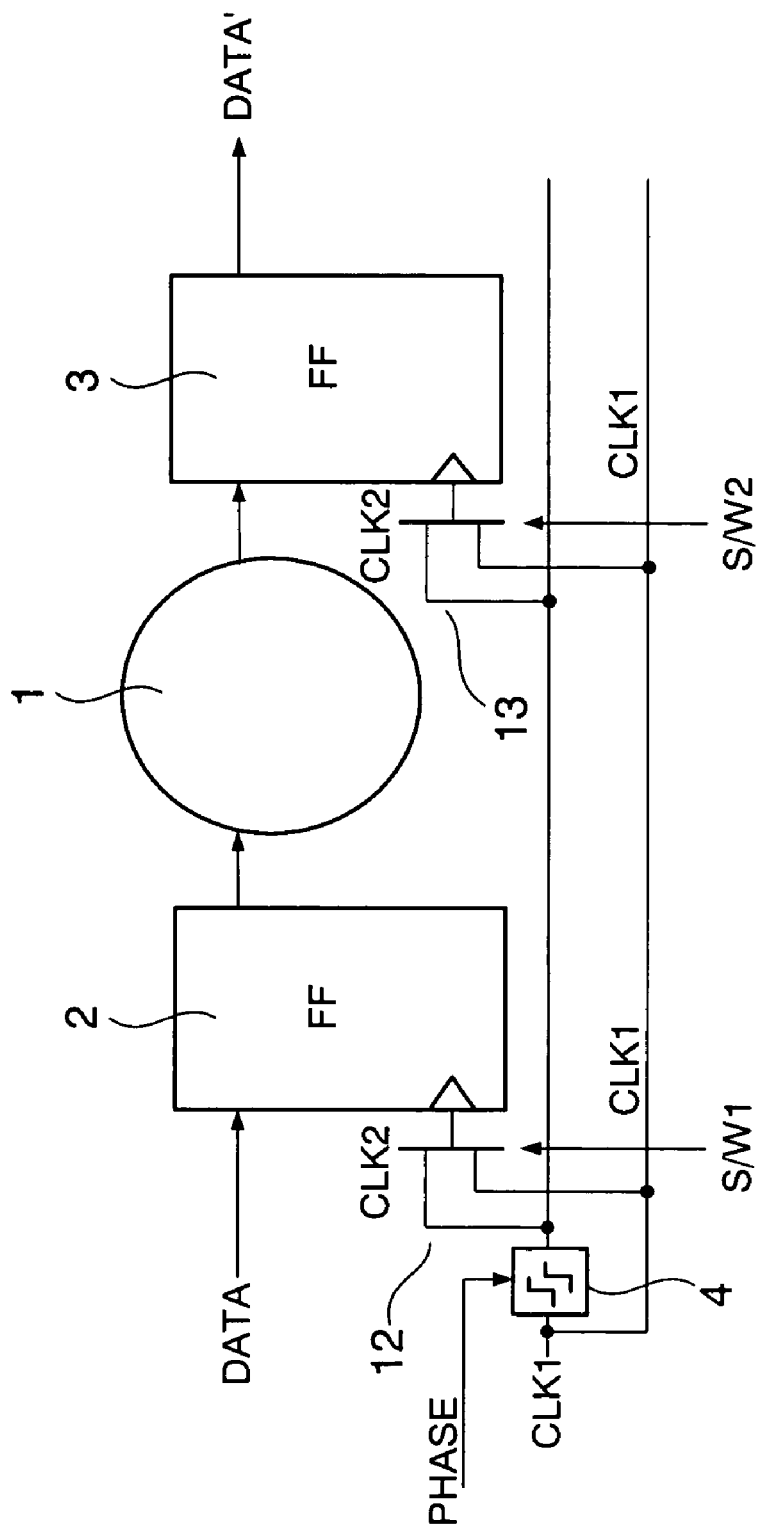
FIG. 5 is a schematic diagram showing the configuration of a semiconductor integrated circuit including an operation test circuit according to a second embodiment.
Figure 6:
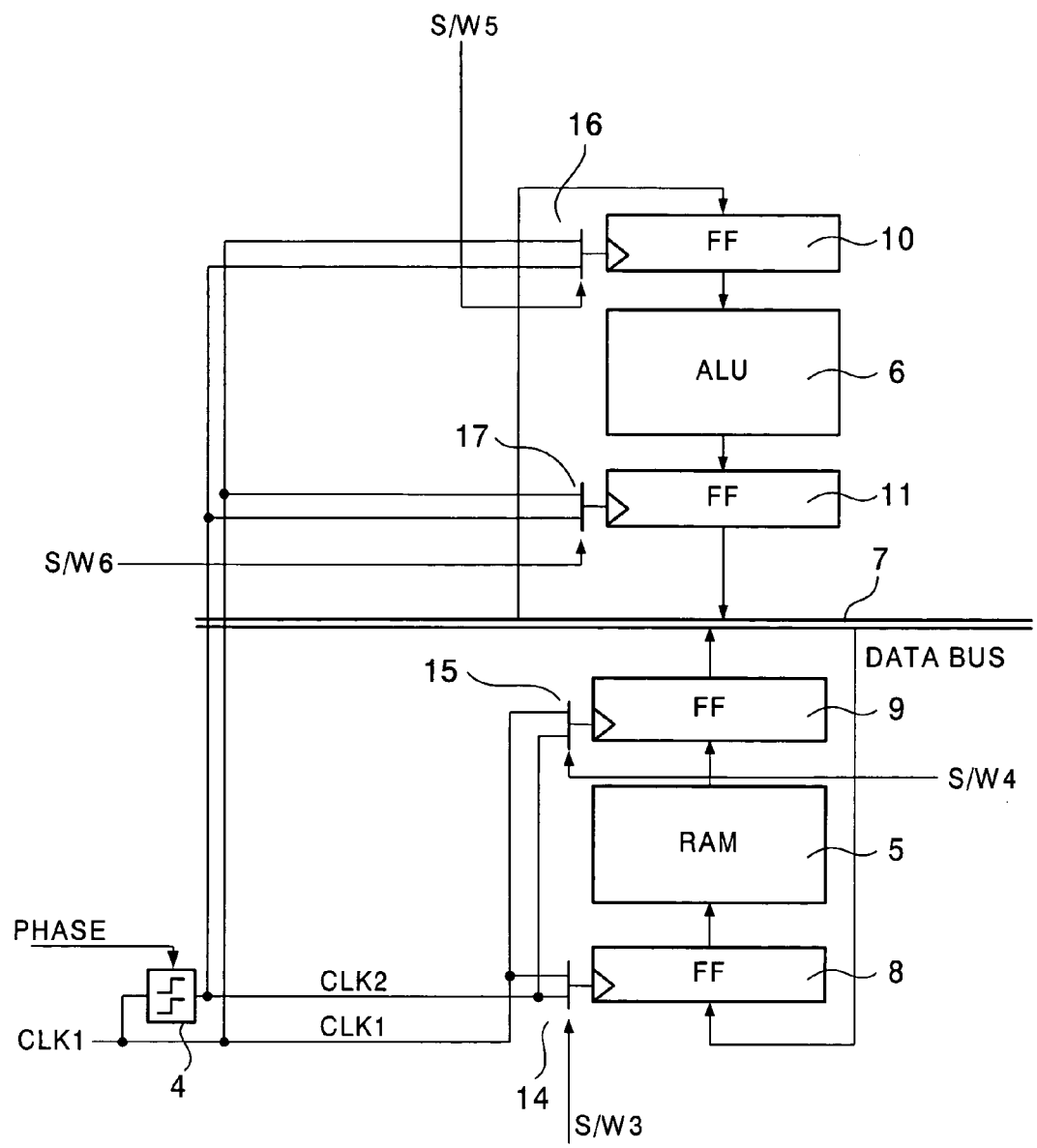
FIG. 6 is a diagram showing the circuit configuration of the semiconductor integrated circuit including the operation test circuit according to the second embodiment.
Figure 7:
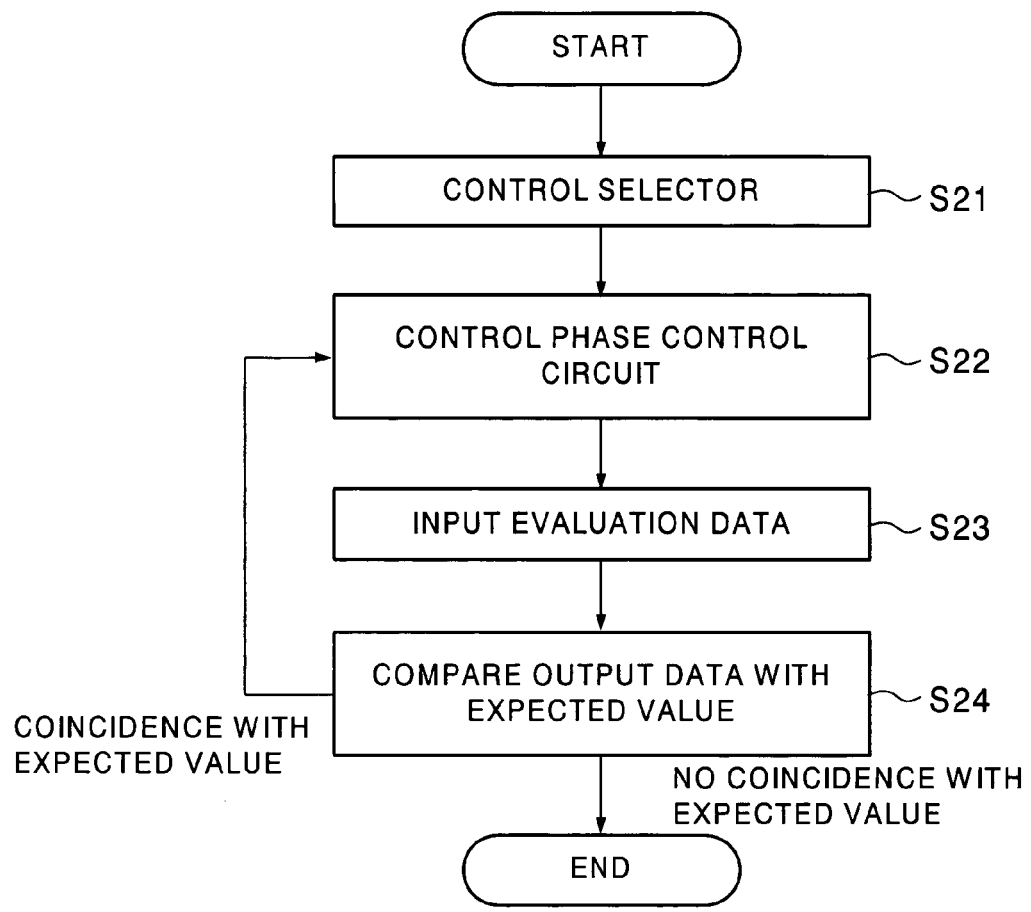
FIG. 7 is a flowchart showing the procedure of an operation test method according to the second embodiment.

Hereinafter, a second embodiment of the semiconductor integrated circuit including the operation test circuit and an operation test method will be explained with reference to FIG. 5 to FIG. 7.

First, a semiconductor integrated circuit including an operation test circuit according to this embodiment will be explained with reference to FIG. 5 and FIG 6. FIG. 5 schematically shows the configuration of the semiconductor integrated circuit including the operation test circuit according to this embodiment. Incidentally, the same numerals and symbols as in FIG. 1 are used to designate components corresponding to those in FIG. 1, so that the explanation thereof are omitted.

A clock signal line is branched to provide two system clock signals, the first clock signal CLK1 used as a system clock and the second clock signal CLK2 whose phase is shifted by the phase control circuit 4. A first selector 12 and a second selector 13 are provided for the first flip-flop 2 and the second flip-flop 3, respectively. The first clock signal CLK1 and the second clock signal CLK2 are inputted to each of these two selectors 12 and 13, and either one of these clock signals is selected and supplied to each of the flip-flops. Incidentally, a first selector control signal S/W1 is inputted to the selector 12 and a second selector control signal S/W2 is inputted to the selector 13, and, for example, by inputting an external command, the test performer can freely set the selection between the clock signals by the respective selectors by transmitting these selector control signals to the respective selectors.

In the normal operation, the first and second selectors 12 and 13 are controlled to supply a clock signal synchronized with the first and second flip-flops 2 and 3 (the first clock signal CLK1 or the second clock signal CLK2) to thereby operate the first and second flip-flops 2 and 3 in synchronization with each other.

On the other hand, in the operation test, different clock signals are supplied to the first and second flip-flops 2 and 3 by use of the first and second selectors 12 and 13 to perform the operation test. Namely, by controlling the selectors, it is set whether a phase difference is provided between a clock signal supplied to a specific flip-flop and a clock signal supplied to the other flip-flop.

Here, the principle of the operation test with an apparently high-frequency clock signal by providing a phase difference between clock signals is the same as that explained by means of FIG. 2 in the first embodiment. Accordingly, after the selection between the clock signals by the selectors, similarly to the first embodiment, the test performer gradually increases the delay time B by controlling the phase control circuit 4 with the phase control signal PHASE and finds a limit at which the expected value which is expected from the inputted evaluation data Data and the actually outputted output data DATA' become non-coincident, so that the maximum operating frequency fmax can be found as 1/(A−Bn) from the delay time Bn when the limit is reached.

Moreover, by providing the aforementioned selectors in the respective flip-flops, a path which is subjected to the operation test at the stage of a mounting test can be selected. This will be explained below with reference to FIG. 6. FIG. 6 exemplifies the circuit configuration of the semiconductor integrated circuit including the operation test circuit according to this embodiment. The same numerals and symbols are used to designate components corresponding to those in FIG. 3 explained in the first embodiment, and hence the explanation thereof is omitted.

A clock signal line is branched to provide two system clock signals, the first clock signal CLK1 used as a system clock and the second clock signal CLK2 whose phase can be shifted by the phase control circuit 4, and a third to sixth selectors 14, 15, 16, and 17 are provided for respective flip-flops so that either one of the clock signals is selected and supplied to each of the flip-flops.

Now, the correspondence between components in FIG. 6 and those in FIG. 5 referred to in the previous explanation will be explained. The RAM 5 and the ALU6 in FIG. 6 correspond to the circuit under test 1 in FIG. 5. The third flip-flop 8 in FIG. 6 corresponds to the first flip-flop 2 in FIG. 5 when the RAM 5 is used as the circuit under test 1, whereas the fifth flip-flop 10 in FIG. 6 corresponds thereto when the ALU 6 is used as the circuit under test 1. Further, the fourth flip-flop 9 in FIG. 6 corresponds to the second flip-flop 3 in FIG. 5 when the RAM 5 is used as the circuit under test 1, whereas the sixth flip-flop 11 in FIG. 6 corresponds thereto when the ALU 6 is used as the circuit under test 1. Furthermore, the third selector 14 in FIG. 6 corresponds to the first selector 12 in FIG. 5 when the RAM 5 is used as the circuit under test 1, whereas the fifth selector 16 in FIG. 6 corresponds thereto when the ALU 6 is used as the circuit under teat 1, and the fourth selector 15 in FIG. 6 corresponds to the second selector 13 in FIG. 5 when the RAM 5 is used as the circuit under test 1, whereas the sixth selector 17 in FIG. 6 corresponds thereto when the ALU 6 is used as the circuit under test 1.

When the maximum operating frequency fmax, for example, of the path from the third flip-flop 3 to the fourth flip flop 9 needs to be evaluated in this circuit, the third selector 14 is allowed to select the second clock signal CLK2 by a third selector control signal S/W3, and the fourth to sixth selectors 15, 16, and 17 are allowed to select the first clock signal CLK1 by a fourth to sixth selector control signals S/W4, S/W5, and S/W6. Thus, when the phase is shifted by the phase control circuit 4, only in the path from the third flip-flop 8 to the fourth flip-flop 9, the frequency of the clock signal becomes apparently high, and hence the maximum operating frequency fmax of only this path can be evaluated without being influenced by the other paths.

Similarly, when the maximum operating frequency fmax, for example, of a path from the fifth flip-flop 10 to the sixth flip-flop 11 needs to be evaluated, it is suitable that the fifth selector 16 be allowed to select the second clock signal CLK2, and the third, fourth, and sixth selectors 14, 15, and 17 be allowed to select the first clock signal CLK1.

As described above, the test performer can freely set the selection between the clock signals by each of the selectors with the selector control signal, whereby in the semiconductor integrated circuit including the operation test circuit according to this embodiment, a desired path on which the test performer wants to perform the operation test at the stage of the mounting test can be selected and the operation test only on the desired path can be performed.

Next, the operation test method of the semiconductor integrated circuit including the operation test circuit according to this embodiment will be explained with reference to FIG. 7. FIG. 7 is a flowchart showing the procedure of the operation test method according to this embodiment. Here, for convenience of explanation, an explanation will be given with a case where the maximum operating frequency fmax of the path from the third flip-flop 8 to the fourth flip-flop 9 is evaluated in the semiconductor integrated circuit including the operation test circuit in FIG. 6 as an example.

First, a path between two flip-flops whose maximum operating frequency max needs to be measured is determined, and selectors provided in respective flip-flops are controlled by selector control signals in such a manner that the second clock signal CLK2 is inputted to either one of the aforementioned two flip-flops and that the first clock signal CLK1 is inputted to the other flip-flops inside the semiconductor integrated circuit (step S21). Here, the path to be evaluated is the path from the third flip-flop 8 to the fourth flip-flop 9 in FIG. 6, whereby the selectors provided in the respective flip-flops are controlled by the selector control signals in such a manner that the second clock signal CLK2 is inputted to either one of the third flip-flop 8 or the fourth flip-flop 9 and that the first clock signal CLK1 is inputted to the other flip-flops.

Then, the apparent frequency $1/(A-B0)$ at which it needs to be first confirmed whether the circuit under test 1 operates normally is determined, and the phase control circuit 4 is allowed to perform the phase control operation by the phase control signal PHASE so that the phase of the first clock signal CLK1 is shifted by B0, and the second clock signal CLK2 is supplied to each of the selectors (step S22).

Subsequently, the evaluation data DATA for the operation test is created and inputted to the RAM 5 (which corresponds to the circuit under test 1 in FIG. 5) (step S23). Thereafter, it is confirmed whether the expected value which is expected from the evaluation data DATA inputted to the RAM 5 and the output data DATA' from the RAM 5 coincide with each other (step S24). The result of a comparison between the expected value and the output data DATA' indicates that the circuit under test 1 normally operates at the apparent frequency $1/(A-B0)$ when these values coincide, whereas it indicates that the operation breaks down at the apparent frequency $1/(A-B0)$ when these values do not coincide.

When the comparison result indicates coincidence in step S24, the procedure returns to step S22, and the phase control circuit 4 is controlled by the phase control signal PHASE to shift the phase of the clock signal CLK1 by B1 (>0) so that the phase difference between the first clock signal CLK1 and the second clock signal CLK2 increases. Subsequently, the evaluation data DATA is inputted to and outputted from the RAM 5, and a comparison with the expected value in step S24 is made again. When the result of the comparison with the expected value indicates non-coincidence, it means that the operation breaks down at the apparent frequency $1/(A-B1)$, whereby it is found that the maximum operating frequency fmax of the path from the third flip-flop 8 to the flip-flop 9 is a value between $1/(A-B0)$ and $1/(A-B1)$.

When the result of the aforementioned second comparison with. the expected value also indicates coincidence, the procedure from step S22 to step S24 is repeated until the result of the comparison with the expected value indicates non-coincidence. Thus, the maximum operating frequency fmax of the path from the third flip-flop 8 to the fourth flip-flop 9 can be measured.

As described above, in the operation test method according to this embodiment, the phase control circuit 4 can be controlled by the phase control signal PHASE, whereby while the apparent clock frequency is increased gradually, the operation of the circuit under test 1 at the increased clock frequency is confirmed, so that the maximum operating frequency fmax at which the circuit under test 1 operates normally can be measured.

Moreover, in the operation test method according to this embodiment, by controlling the selectors by the selector control signals, the test performer can freely set a path on which the operation test is to be performed at the stage of performing the operation test, and can measure the maximum operating frequency fmax of only the path which needs to be evaluated instead of the entire semiconductor integrated circuit.

Incidentally, in the operation test method according to this embodiment, first the selectors are controlled (step S21), then the phase control circuit 4 is controlled (step 22), and thereafter the evaluation data DATA is inputted (step S23), but the order of these steps is not limited to this. The same effect can be obtained as long as step S24 is performed after these three steps (S21, S22, and S23) are completed irrespective of the order of these steps.

Moreover, in the semiconductor integrated circuit including the operation test circuit according to this embodiment and the operation test method thereof, the case where the phase of the clock signal inputted to the first flip-flop 2 is shifted by the phase control circuit 4 to perform the operation test is shown, but in addition to this case, for example, the phase of the clock signal supplied to the second flip-flop may be shifted by the phase control circuit 4. Further, the clock signal inputted to flip-flops other than the flip-flops provided at both ends of the path to be evaluated in the operation test is not limited to the first clock signal CLK1, but it may be the second clock signal CLK2.

Furthermore, also in the semiconductor integrated circuit including the operation test circuit according to this embodiment and the operation test method thereof, similarly to the first embodiment, a positive edge type flip-flop is used as each of the flip-flops. On the other hand, even when a negative edge type flip-flop is used as each of these flip-flops, the same effect as the case where the positive edge type flip-flops are used can be obtained.

Besides, also in the semiconductor integrated circuit including the operation test circuit according to this embodiment and the operation test method thereof, the RAM and the ALU are shown as examples of the circuit under test 1, but, similarly to the first embodiment, the circuit under test 1 is not limited to these, and the configuration thereof does not matter.

(Third Embodiment)

Hereinafter, a third embodiment of the semiconductor integrated circuit including the operation test circuit will be explained with reference to FIG. 8 to FIG. 9.

Figure 8:
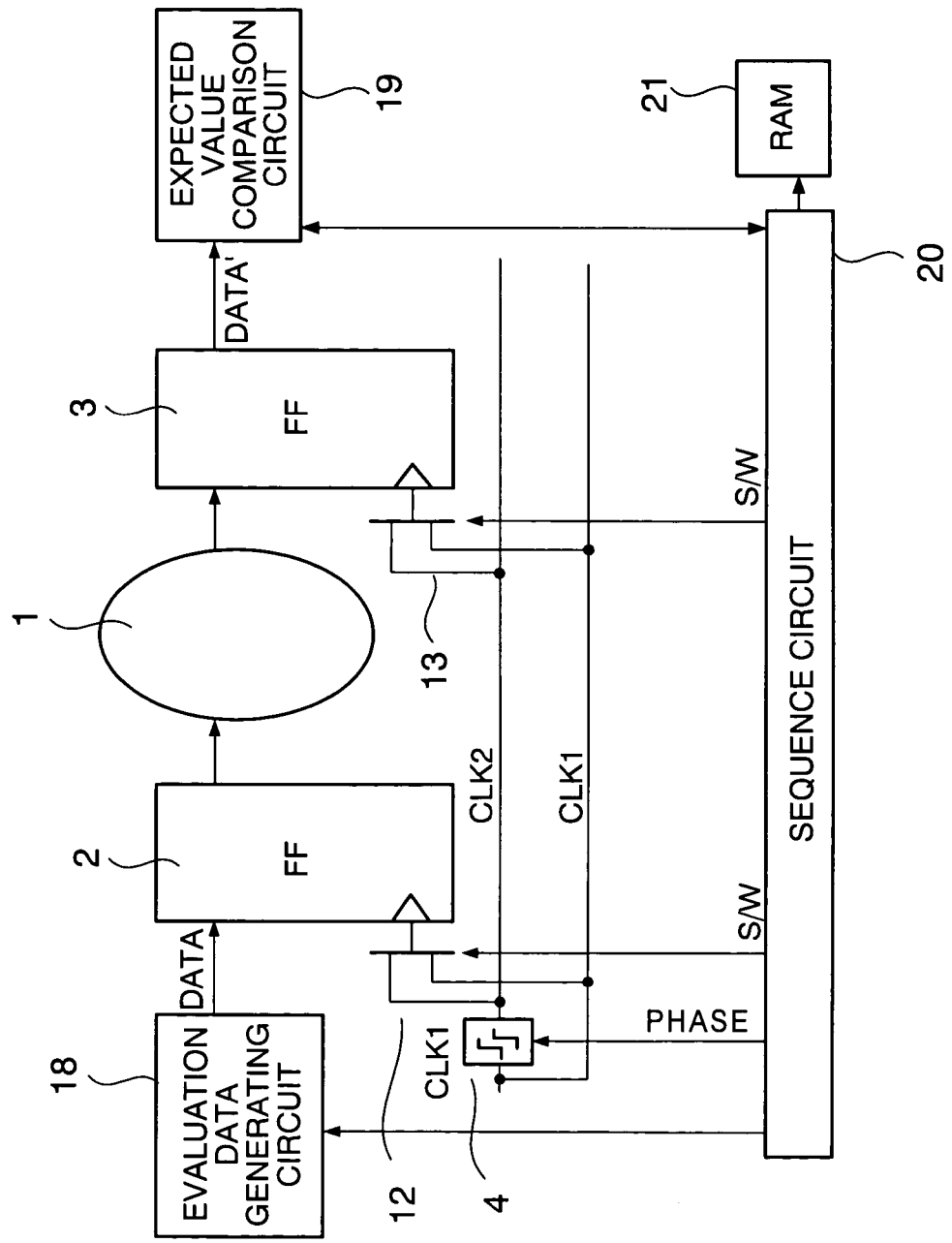
FIG. 8 is a schematic diagram showing the configuration of a semiconductor integrated circuit including an operation test circuit according to a third embodiment.
Figure 9:
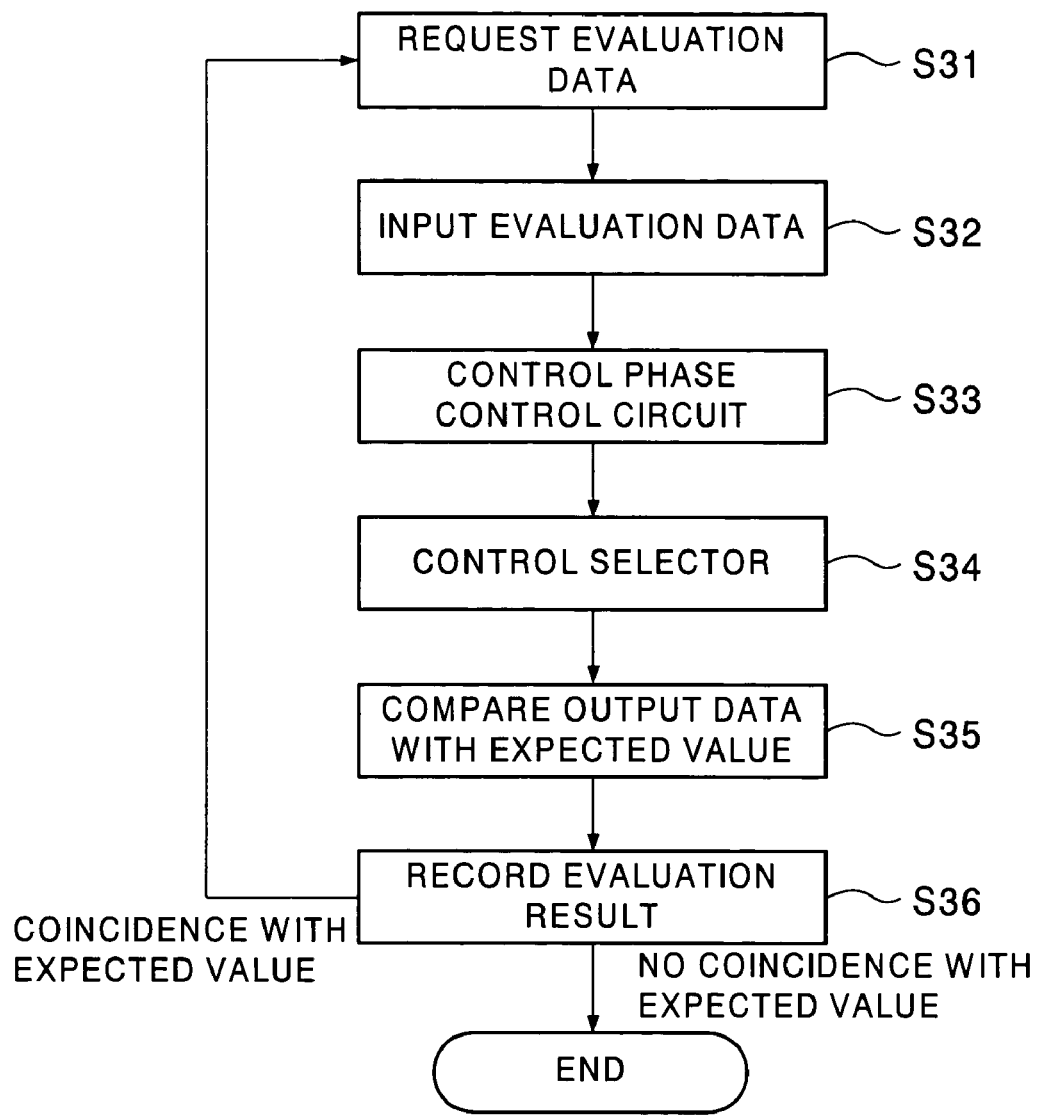
FIG. 9 is a flowchart showing the procedure of a self-test performed by the semiconductor integrated circuit including the operation test circuit according to the third embodiment.
Figure 10:
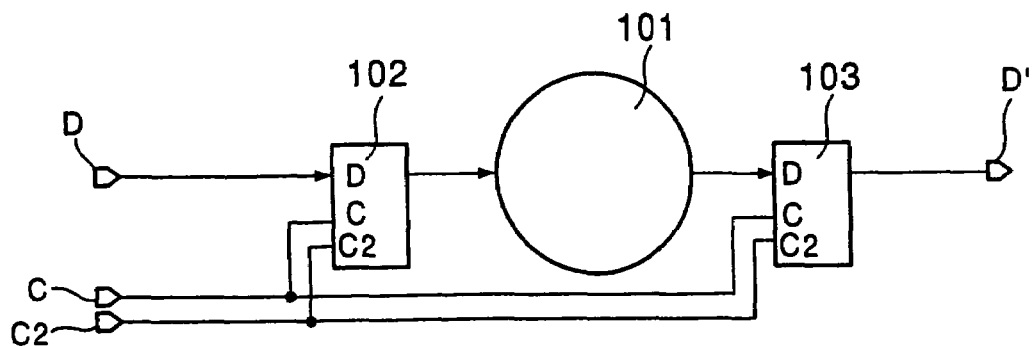
FIG. 10 is a diagram showing the circuit configuration of a related operation test circuit.
Figure 11:
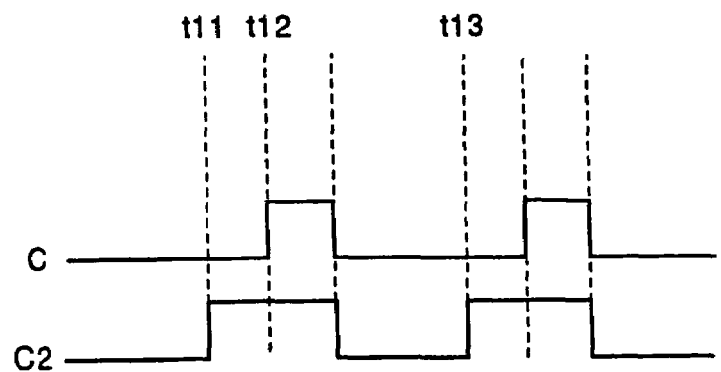
FIG. 11 is a waveform diagram of clock signals for flip-flop control in an operation test in the related operation test circuit.

FIG. 8 schematically shows the configuration of a semiconductor integrated circuit including an operation test circuit according to the third embodiment. It is noted that since the configuration of the operation test circuit according to this embodiment is partly in common with the configurations of the operation test circuits according to the first and second embodiments, the same numerals and symbols are used to designate components corresponding to those in FIG. 1 and FIG. 5, and the explanation thereof is omitted.

An evaluation data generating circuit 18 generates the evaluation data DATA and supplies it to the first flip-flop 2, an output of the circuit under test 1 outputted via the second flip-flop 3 by the input of the evaluation data DATA is supplied to an expected value comparison circuit 19, and the expected value comparison circuit 19 compares an inputted output result of the circuit under test 1 and an expected value expected from the evaluation data DATA and outputs the result thereof to a sequence circuit 20.

The sequence circuit 20 is a circuit which controls the operations of the evaluation data generating circuit 18, the expected value comparison circuit 19, the phase control circuit 4, and the first and second selectors 12 and 13, and which writes the result of the operation test into a RAM 21.

The operation of the semiconductor integrated circuit including this operation test circuit in a self-test will be explained with reference to FIG. 9. FIG. 9 is a flowchart explaining the procedure of the self-test performed by the semiconductor integrated circuit including the operation test circuit according to this embodiment.

First, the sequence circuit 20 requests the evaluation data generating circuit 18 to generate the evaluation data DATA (S31). Then, the evaluation data generating circuit 18 generates the evaluation data DATA in response to the request of the sequence circuit 20 and outputs the evaluation data DATA to the first flip-flop 2 (S32).

Thereafter, the sequence circuit 20 allows the phase control circuit 4 to perform the phase control operation by the phase control signal PHASE to control the phase of the first clock signal CLK1 in such a manner that an apparent clock signal having a frequency at which the operation test first needs to be performed (an initial operation frequency) is generated. The value of the initial operation frequency here may be inputted from the outside or may be stored in advance in a storage area inside the semiconductor integrated circuit by the test performer.

Subsequently, the sequence circuit 20 controls the selectors by selector control signals S/W to determine whether either one of the first or the second clock signal is supplied to each of the flip-flops (step S34). Here, for convenience of explanation, only two selectors 12 and 13 are shown, but actually a case is assumed where two or more selectors are provided, and a path on which the operation test is practically performed is determined in this step as explained by means of FIG. 6 in the second embodiment. Moreover, data on the selection between the clock signals by the selectors also may be inputted from the outside or may be stored in advance in the storage area inside the semiconductor integrated circuit by the test performer.

Then, the expected value comparison circuit 19 compares the output data DATA' of the circuit under test 1 which is outputted via the second flip-flop 3 and an expected value which is expected from the evaluation data DATA (S35). The result of the comparison means that the circuit under test 1 normally operates at the apparent clock frequency when the output result of the circuit under test 1 and the expected value coincide with each other, whereas it means that the operation of the circuit under test 1 fails at the apparent clock frequency when they are different from each other. Thereafter, the expected value comparison circuit 19 outputs the comparison result to the sequence circuit 20. This comparison result is written into the RAM 21 by the sequence circuit 20 and held therein (S36).

When the output result of the circuit under test 1 and the expected value are different in the aforementioned comparison, the sequence circuit 20 completes the self-test at this point, and when they coincide, the phase of the second clock signal CLK2 is further shifted by a predetermined amount with respect to the phase of the first clock signal CLK1 in step S33, and the aforementioned steps (S31 to 36) are performed again. Here, the selection between the clock signals by the selectors in step S34 is fixed. The procedure of the self-test shown in FIG. 9 is repeated until the comparison result in step S35 indicates coincidence. The aforementioned procedure makes it possible to find a clock frequency at a limit where the comparison result indicates coincidence, read the result thereof by the RAM 21, and thereby obtain the maximum operating frequency fmax of the circuit under test 1.

When the operation test needs to be performed on plural paths, the maximum operating frequency fmax of the second path can be obtained if, after the maximum operating frequency fmax of the first path to be evaluated is found, the selection between the clock signals by the selectors in step S34 is changed and the same procedure as in the first path is performed.

As described above, in the semiconductor integrated circuit including the operation test circuit according to this embodiment, a circuit which automatically performs a series of works of the operation test explained in the second embodiment is incorporated in the semiconductor integrated circuit, and hence the test performer does not need to perform control from the outside at each stage of the operation test, which leads to a rise in the working efficiency of the operation test.

Incidentally, also in this embodiment, similarly to the first and second embodiments, a positive edge type flip-clop which is used as each of the flip-flops. On the other hand, even when a negative edge type flip-flop is used as each of these flip-flops, the same effect as the case where the positive edge type flip-flops are used can be obtained.

Further, various modification can be made without departing from the spirit of the present invention in embodying the present invention.

What is claimed is:

1. A semiconductor integrated circuit, comprising:
   a phase control circuit to which a first clock signal is inputted, and which shifts a phase of the first clock signal based on a phase control signal and outputs the resultant signal as a second clock signal;
   a first flip-flop to which one of the first clock signal and the second clock signal is inputted as a first operation clock signal, and which operates in synchronization with an edge of the inputted first operation clock signal and outputs evaluation data;
   a circuit under test to which the evaluation data is inputted, and which performs a predetermined process based on the evaluation data and outputs a result of the process as output data; and
   a second flip-flop to which the other of the first clock signal and the second clock signal is inputted as a second operation clock signal and the output data is inputted, and which operates in synchronization with an edge of the inputted second operation clock signal and outputs the output data inputted from the circuit under test.

2. The semiconductor integrated circuit according to claim 1, wherein the phase control signal is inputted from outside of the semiconductor integrated circuit.

3. The semiconductor integrated circuit according to claim 2, wherein in a normal operation, the phase control signal such that the first clock signal and the second clock signal are synchronized is inputted.

4. The semiconductor integrated circuit according to claim 3, wherein in an operation test, the phase control signal such that a phase difference is formed between the first clock signal and the second clock signal is inputted.

5. A control method of a semiconductor integrated circuit, comprising:
   controlling a phase control circuit based on a phase control signal to shift a phase of a first clock signal and outputting the resultant signal as a second clock signal;
   inputting one of the first clock signal and the second clock signal as a first operation clock signal to a first flip-flop, operating the first flip-flop in synchronization with an edge of the inputted first operation clock signal, and outputting evaluation data;
   inputting the evaluation data to a circuit under test, performing a predetermined process based on the evaluation data, and outputting a result of the process as output data; and
   inputting the other of the first clock signal and the second clock signal as a second operation clock signal to a second flip-flop and inputting the output data, operating the second flip-flop in synchronization with an edge of the inputted second clock signal, and outputting the output data inputted from the circuit under test.

6. The control method of the semiconductor integrated circuit according to claim 5, further comprising inputting the phase control signal from outside of the semiconductor integrated circuit.

7. The control method of the semiconductor integrated circuit according to claim 6, wherein in a normal operation, the phase control signal such that the first clock signal and the second clock signal are synchronized is inputted.

8. The control method of the semiconductor integrated circuit according to claim 7, wherein in an operation test, the phase control signal such that a phase difference is formed between the first clock signal and the second clock signal is inputted.

9. A semiconductor integrated circuit, comprising:
   a phase control circuit to which a first clock signal is inputted, and which shifts a phase of the first clock signal based on a phase control signal and outputs the resultant signal as a second clock signal;
   a first selector to which the first clock signal and the second clock signal are inputted, and which outputs one of the first clock signal and the second clock signal as a first operation clock signal based on a first selector control signal;
   a first flip-flop to which the first operation clock signal is inputted, and which operates in synchronization with an edge of the first operation clock signal and outputs evaluation data;
   a circuit under test to which the evaluation data is inputted, and which performs a predetermined process based on the evaluation data and outputs a result of the process as output data;
   a second selector to which the first clock signal and the second clock signal are inputted, and which outputs the other of the first clock signal and the second clock signal as a second operation clock signal based on a second selector control signal; and
   a second flip-flop to which the second operation clock signal is inputted and the output data is inputted, and which operates in synchronization with an edge of the second operation clock signal and outputs the output data inputted from the circuit under test.

10. The semiconductor integrated circuit according to claim 9, wherein the phase control signal, the first selector control signal, and the second selector control signal are inputted from outside of the semiconductor integrated circuit.

11. The semiconductor integrated circuit according to claim 10, wherein in a normal operation, the phase control signal, the first selector control signal, and the second selector control signal such that the first clock signal and the second clock signal are synchronized are inputted.

12. The semiconductor integrated circuit according to claim 11, wherein in an operation test, the phase control signal, the first selector control signal, and the second selector control signal such that a phase difference is formed between the first clock signal and the second clock signal are inputted.

13. A control method of a semiconductor integrated circuit, comprising:
  controlling a phase control circuit based on a phase control signal to shift a phase of a first clock signal and outputting the resultant signal as a second clock signal;
  controlling a first selector based on a first selector control signal to output one of the first clock signal and the second clock signal as a first operation clock signal;
  inputting the first operation clock signal to a first flip-flop, operating the first flip-flop in synchronization with an edge of the first operation clock signal, and outputting evaluation data;
  inputting the evaluation data to a circuit under test, performing a predetermined process based on the evaluation data, and outputting a result of the process as output data;
  controlling a second selector based on a second selector control signal to output the other of the first clock signal and the second clock signal as a second operation clock signal; and
  inputting the second operation clock signal to a second flip-flop and inputting the output data, operating the second flip-flop in synchronization with an edge of the inputted second clock signal, and outputting the output data inputted from the circuit under test.

14. The control method of the semiconductor integrated circuit according to claim 13, further comprising inputting the phase control signal, the first selector control signal, and the second selector control signal from outside of the semiconductor integrated circuit.

15. The control method of the semiconductor integrated circuit according to claim 14, wherein in a normal operation, the phase control signal, the first selector control signal, and the second selector control signal such that the first clock signal and the second clock signal are synchronized are inputted.

16. The control method of the semiconductor integrated circuit according to claim 15, wherein in an operation test, the phase control signal, the first selector control signal, and the second selector control signal such that a phase difference is formed between the first clock signal and the second clock signal are inputted.

17. A semiconductor integrated circuit, comprising:
  a phase control circuit to which a first clock signal is inputted, and which shifts a phase of the first clock signal based on a phase control signal and outputs the resultant signal as a second clock signal;
  a first selector to which the first clock signal and the second clock signal are inputted, and which outputs one of the first clock signal and the second clock signal as a first operation clock signal based on a first selector control signal;
  an evaluation data generating circuit which generates evaluation data and outputs the evaluation data;
  a first flip-flop to which the first operation clock signal and the evaluation data are inputted, and which operates in synchronization with an edge of the first operation clock signal and outputs the evaluation data;
  a circuit under test to which the evaluation data is inputted, and which performs a predetermined process based on the evaluation data and outputs a result of the process as output data;
  a second selector to which the first clock signal and the second clock signal are inputted, and which outputs the other of the first clock signal and the second clock signal as a second operation clock signal based on a second selector control signal;
  a second flip-flop to which the second operation clock signal is inputted and the output data is inputted, and which operates in synchronization with an edge of the second operation clock signal and outputs the output data inputted from the circuit under test;
  an expected value comparison circuit to which the output data is inputted from the second flip-flop, and which compares an expected value expected from the evaluation data and the output data; and
  a sequence circuit which controls the phase control circuit, the first selector, the second selector, the evaluation data generating circuit, and the expected value comparison circuit and, wherein the sequence circuit sequentially shifts a phase of the second clock signal so that a phase difference between the first clock signal and the second clock signal increases until the output data and the expected value become non-coincident when the output data and the expected value coincide in the expected value comparison circuit.

18. The semiconductor integrated circuit according to claim 17, wherein the phase control signal, the first selector control signal, and the second selector control signal are generated by the sequence circuit.

19. A control method of a semiconductor integrated circuit, comprising:
  controlling a phase control circuit based on a phase control signal to shift a phase of a first clock signal and outputting the resultant signal as a second clock signal;
  controlling a first selector based on a first selector control signal to output one of the first clock signal and the second clock signal as a first operation clock signal;
  generating evaluation data in an evaluation data generating circuit and outputting the evaluation data from the evaluation data generating circuit;
  inputting the first operation clock signal and the evaluation data to a first flip-flop, operating the first flip-flop in synchronization with an edge of the first operation clock signal, and outputting the evaluation data;
  inputting the evaluation data to a circuit under test, performing a predetermined process based on the evaluation data, and outputting a result of the process as output data;
  controlling a second selector based on a second selector control signal to output the other of the first clock signal and the second clock signal as a second operation clock signal;
  inputting the second operation clock signal and the output data to a second flip-flop, operating the second flip-flop in synchronization with an edge of the second clock signal, and outputting the output data inputted from the circuit under test;
  inputting the output data from the second flip-flop to an expected value comparison circuit and comparing an expected value expected from the evaluation data and the output data; and
  controlling the phase control circuit, the first selector, the second selector, the evaluation data generating circuit, and the expected value comparison circuit, and sequentially shifting a phase of the second clock signal so that a phase difference between the first clock signal and the second clock signal increases until the output data and the expected value become non-coincident when the output data and the expected value coincide in the expected value comparison circuit.

20. The control method of the semiconductor integrated circuit according to claim 19, further comprising generating the phase control signal, the first selector control signal, and the second selector control signal.

* * * * *